Oct. 8, 1940. L. WALSH Re. 21,598

RADIO RECEIVER

Original Filed March 5, 1934 4 Sheets-Sheet 1

INVENTOR
LINCOLN WALSH
BY C. R. Gauthier
ATTORNEY

RADIO RECEIVER

Original Filed March 5, 1934 4 Sheets-Sheet 2

INVENTOR
LINCOLN WALSH
BY C. R. Saulthier
ATTORNEY

Oct. 8, 1940. L. WALSH Re. 21,598

RADIO RECEIVER

Original Filed March 5, 1934 4 Sheets-Sheet 3

INVENTOR
LINCOLN WALSH
BY C. M. Gauthier
ATTORNEY

RADIO RECEIVER

Original Filed March 5, 1934 4 Sheets-Sheet 4

INVENTOR
LINCOLN WALSH
BY C. R. Gauthier
ATTORNEY

Reissued Oct. 8, 1940

Re. 21,598

UNITED STATES PATENT OFFICE 21,598

RADIO RECEIVER

Lincoln Walsh, Elizabeth, N. J.

Original No. 2,037,445, dated April 14, 1936, Serial No. 714,037, March 5, 1934. Application for reissue April 21, 1937, Serial No. 138,192

9 Claims. (Cl. 250—20)

This invention relates to radio receiving systems and apparatus and has to do more especially with superheterodyne receivers.

Because of the fact that the frequency separation between broadcasting channels is only ten kilocycles, whereas the frequency band essential to high fidelity is of the order of sixteen kilocycles, it follows that high selectivity (which is necessary for satisfactory long distance reception) is incompatible with fine tone quality. That is to say, with the existing ten kilocycle channel separation, it is impossible to secure at one and the same time both sharp selectivity and a high degree of tone fidelity.

The type of broadcast receiving circuit in most general use at the present time is the superheterodyne. This is due in large measure to the fact that the superheterodyne is inherently capable of sharp selectivity and more constant selectivity over the entire broadcast band without incurrence of the difficulties which ordinarily accompany the realization of comparable selectivity with other types of broadcast receiving circuits. With the superheterodyne, as with other receiving systems, sharp selectivity and fine tone quality cannot obtain simultaneously; and, insofar as I have been able to ascertain, there has, heretofore, never been devised a superheterodyne receiver capable of sharp selectivity for distant reception (that is, for reception of weak signal waves) and relatively broad selectivity for reception from less distant stations (that is, strong signal waves), whereby is obtainable the maximum tone quality consistent with the momentarily necessary degree of selectivity. That, in brief, is the major object of the present invention; which is to say, to provide a superheterodyne receiver wherein the sharpness of selectivity is easily and quickly variable, to the end that fine tone quality may be realized whenever sharp tuning is not necessary and, conversely, that sharp selectivity may be realized whenever interference between transmitting stations would otherwise obtain.

In superheterodyne receivers selectivity is secured chiefly in the intermediate frequency amplifier wherein the interstage coupling circuits are sharply tuned to some predetermined intermediate frequency value—generally one hundred and seventy-five kilocycles. These amplifiers, as heretofore designed and constructed, will pass the intermediate frequency and a relatively narrow side-band on either side thereof without excessive attenuation. The narrower the side bands permitted to pass the greater is the selectivity of the receiver and conversely the wider the side bands the less the selectivity. But the broader the side bands passed without excessive attenuation the finer is the possible tone quality and, conversely, the narrower the side bands passed without excessive attenuation the poorer the possible tone quality. Because the purchasing public is prone to judge a receiver by its ability to bring in distant stations, it is believed to have been universally considered necessary in commercial broadcast receivers to design the intermediate frequency amplifiers to cut off sharply considerably below ten kilocycles on either side of the intermediate carrier frequency in order to preserve the requisite degree of selectivity for distant reception. This, of course, definitely limited the quality of reproduction to the best obtainable without the higher frequencies even when receiving from local stations under conditions not requiring sharp selectivity. It is true that tone fidelity of a fairly high order and satisfactory for many purposes can be realized in the absence of the higher frequencies, but there is, nevertheless, a vast difference between what can be accomplished with a frequency band limited as in the past and that which can be accomplished with a band wide enough to include all the desirable audio frequencies—that is, up to, say, sixteen kilocycles.

Broadly, one of the major features of the present invention is the provision in a superheterodyne receiver, of an intermediate frequency amplifier wherein the width of the side bands capable of being passed without over-attenuation is variable at the will of the operator. This is accomplished without altering, or at least, without materially altering the resonance frequency to which the interstage couplings are tuned and preferably by varying the interstage coupling at one or more of the intermediate amplifier coupling circuits or between the intermediate frequency amplifier and the second detector—preferably both.

There are numerous possible and more or less practicable alternative arrangements within the scope and purview of the presently considered feature—as will later be evident to those familiar with this art—but the arrangement which I have so far found most desirable consists in providing means for simultaneously varying the coupling in three successive tuned-transformer coupling circuits in the intermediate amplifier and between that amplifier and the second detector—the inductive coupling between primary and secondary windings being preferably adjustable by the operator.

Another feature—subordinate to that just previously mentioned—consists in an arrangement to be described whereby a certain compensating effect is accomplished as between the several successive coupling circuits to the end that all frequencies within the band intended to be passed are transmitted with substantially equal attenuation, thereby achieving a degree of tone fidelity which would not otherwise be obtainable. This result is brought about by providing for a predetermined difference in coupling variation as between different successive coupling circuits so that frequencies disproportionately attenuated in one or more stages are correspondingly under-attenuated in another stage—the over-all resultant being that all frequencies within the desired band are passed with substantially equal facility—hence with an absence of material distortion.

For the purpose of diminishing the effective noise resulting from extraneous electrical disturbances such as static and the whistle due to the heterodyning of interfering stations it is desirable to provide in the receiver an adjustable audio-frequency filter, the cut-off point of which can be adjusted, as needed, to eliminate the higher frequencies. The use of such a filter for the purpose stated is not novel, per se, and is not claimed of itself as a part of this invention; but I have discovered that the optimum adjustments of such filters under varying circumstances bear a very definite relation to the optimum adjustments of the intermediate frequency amplifier under croresponding conditions and this has led to the further discovery that it is practicable to mechanically tie together the filter adjusting means and the intermediate frequency amplifier adjusting means so that by the operation of a single control medium, both adjustments are effected simultaneously—thus greatly simplifying the operation of the receiver. This constitutes another important feature of the present invention.

Still another feature of this invention consists in a novel method of tuning the intermediate frequency coupling systems; and this is applicable alike to receivers having variably coupled intermediate frequency coupling systems in accordance with the present invention and to receivers wherein the coupling is fixed in conformity with the prior practice.

These coupling systems consist each of a pair of inductively coupled tunable circuits, each of which is intended to be tuned to the intermediate frequency, and the coupling therebetween is, of necessity, greater than what is known as critical coupling. If less than critical coupling were employed the band of frequencies passed would be too narrow for good reproduction. But with coupling greater than "critical" the tunable circuits making up each pair react upon each other so that the tuning of either changes the tuning of the other—which makes it difficult to get the individual tunable circuits tuned accurately to the intermediate frequency. I have discovered that by loosening the coupling to a point below critical coupling and then adjusting each circuit to the intermediate frequency the problem of tuning is greatly simplified and that much time may thus be saved. And that applies with equal force whether the coupling is to be variable in operation according to the present invention or fixed in accordance with prior established practice.

Additional features of this invention are to be found in certain novel structural arrangements which will be described in detail hereinafter with reference to the accompanying drawings.

Referring to the drawings:

Fig. 1 is a circuit diagram of so much of a radio receiving system as is essential to illustrate the present invention;

Figs. 2, 3, 4, and 5 respectively, are resonance curves pertaining to the intermediate frequency coupling systems;

Figure 6:
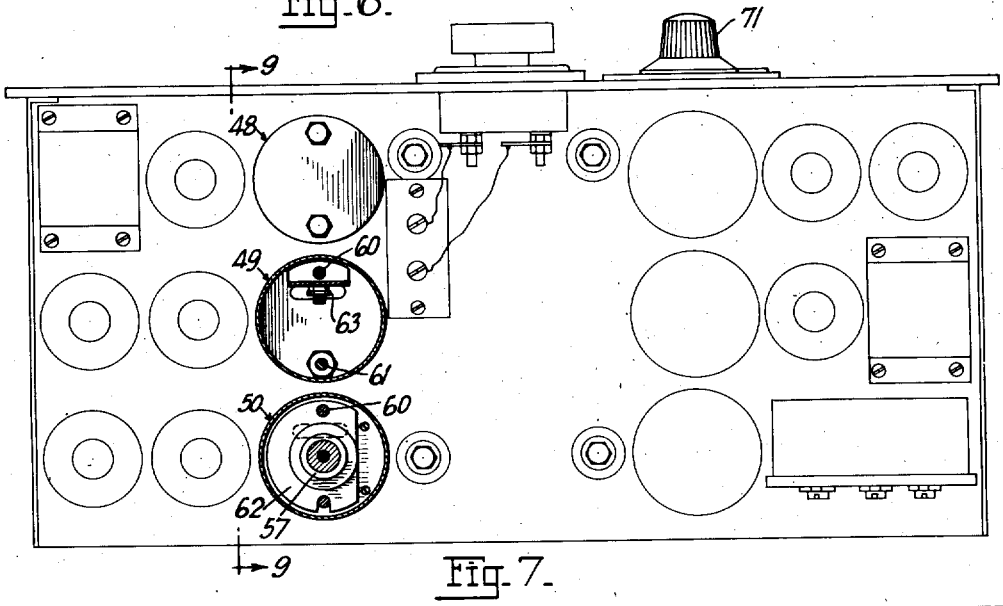
Fig. 6 is a plan view, partly in section, of a radio receiver chassis.
Figure 7:
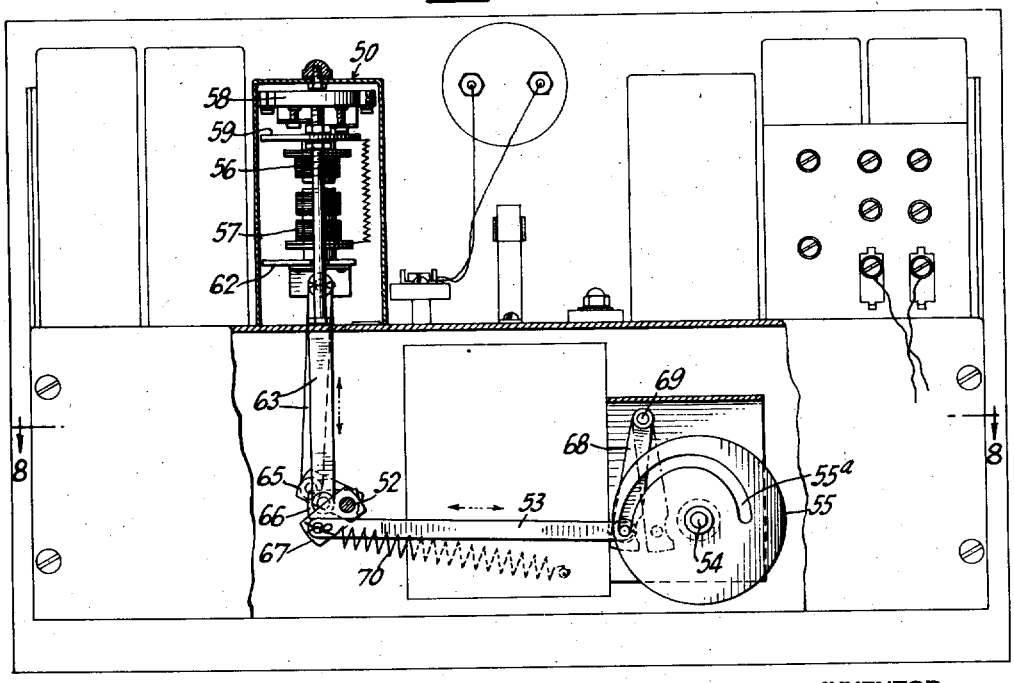
Fig. 7 is a rear elevational view, partly in section, of the same chassis.
Figure 8:
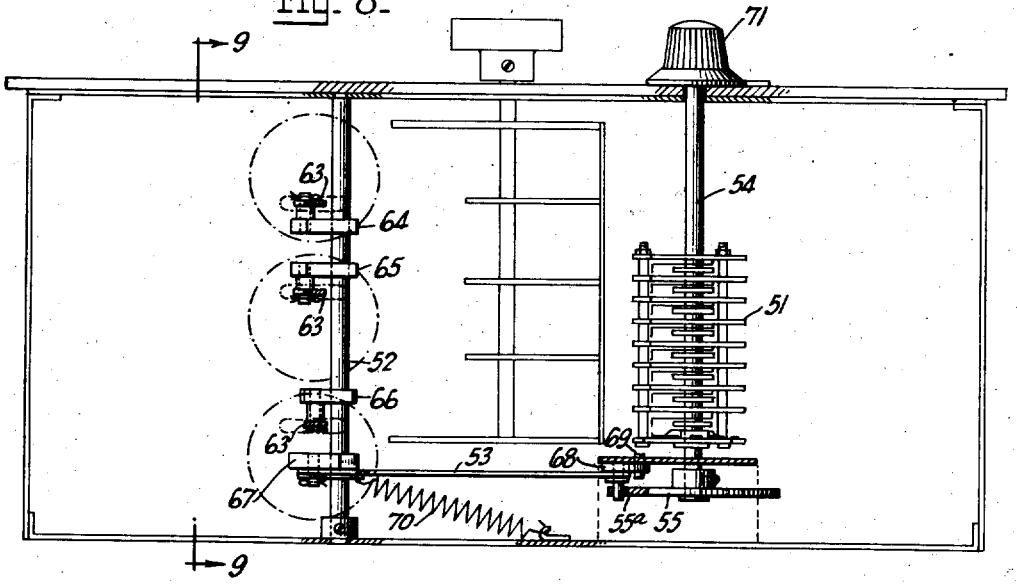
Figure 9:
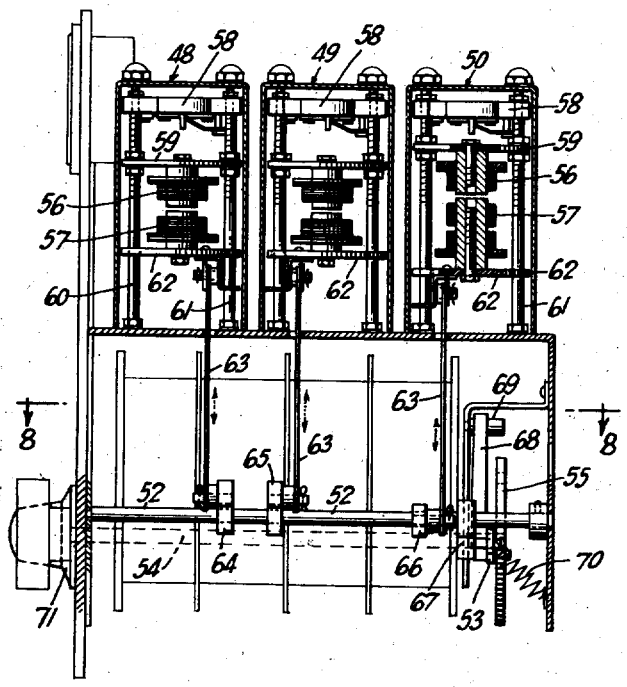

Fig. 8 is a horizontal sectional view taken approximately along the line 8—8 of Figs. 7 and 9; and Fig. 9 is a cross sectional view taken along the line 9—9 of Figs. 6 and 8.

Figure 1:
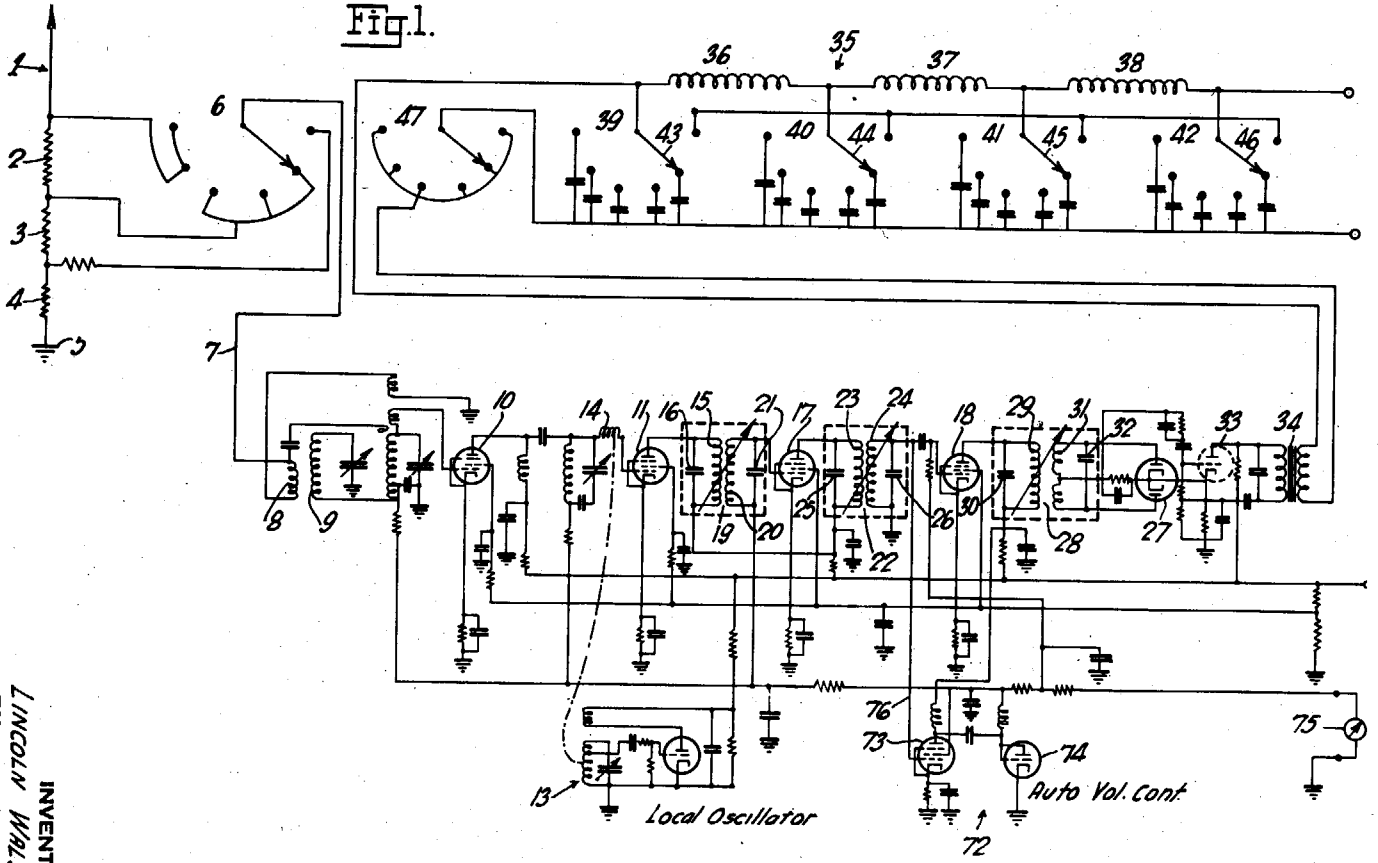

The circuit diagram, Fig. 1, is intended to illustrate schematically the novel features of the present invention applied to an otherwise more or less conventional superheterodyne broadcast receiver.

It is thought unnecessary to describe in extensive detail the entire circuit illustrated or to dwell at length upon the well known principles of operation of superheterodyne receivers. It seems appropriate, however, to describe rather briefly the whole system illustrated as a background for a more detailed description of the novel features to which the appended claims are directed.

Referring to Fig. 1, numeral 1 designates as an entirety the receiving antenna, including series resistances 2, 3, and 4—the antenna being grounded at 5. Associated with the antenna is a multi-contact rotary antenna switch 6, the function of which is to change the point of connection of the receiver to the antenna for the purpose of increasing and diminishing the effectiveness of the antenna; or, putting it another way, for the purpose of increasing and diminishing the amount of antenna voltage applied to the input end of the receiver. In general, it is desirable, if not necessary, to set the antenna switch for maximum voltage for the reception of very weak signals whereas for the reception of strong signals it is desirable to reduce the antenna voltage in order to eliminate distortion due to overloading of the tubes.

A conductor 7 extends from the movable contact of antenna switch 6 to one end of the primary winding 8 of a radio frequency input transformer 9.

The incoming signal waves are impressed through the medium of primary winding 8 upon the input side of a vacuum tube 10 which functions as a radio frequency amplifier for the incoming high frequency signal wave. The circuit connections immediately associated with the amplifier tube 10 are more or less conventional and familiar to those skilled in this art for which reason it is thought that it would be superfluous to burden this specification with a detailed description of them.

Following the radio frequency amplifier tube 10 is a second vacuum tube 11 which may properly be referred to as a converter, translator, or first detector—these terms being used more or less interchangeably in the art with respect to this tube. Its function is to combine the amplified incoming high frequency signal-modulated wave with a locally generated high frequency unmodulated wave to produce a beat frequency or, what it is generally termed, an intermediate frequency signal-modulating wave. The locally generated high frequency wave may be, as in the case illustrated, generated by a high frequency vacuum tube oscillator which is here designated as a whole by reference numeral 13. This local oscillator is of a conventional type requiring no description and is inductively coupled to a coil 14 in the input or control circuit of the converter tube 11.

The frequency generated by the local oscillator 13 is always different from that of the incoming high frequency wave by an amount equal to some predetermined fixed value—which value is now most generally, but not always, one hundred and seventy-five kilocycles. That is to say, whatever frequency the receiver may be tuned to receive at any given time, the local oscillator generates a frequency which is different therefrom by one hundred and seventy-five kilocycles—or whatever other value may have been determined upon by the designer of the set.

Assuming that the predetermined beat or intermediate frequency is one hundred and seventy-five kilocycles, the output circuit, comprising the transformer primary winding 15 and tuning condenser 16, is tuned to that frequency.

Following the converter tube 11 are shown two intermediate or beat frequency amplifier tubes, 17 and 18 respectively. The input side of tube 17 is coupled with the output side of tube 11 through the medium of a coupling transformer 19 comprising primary winding 15 and a secondary winding 20. The primary winding 15, as already stated, is tuned by means of the condenser 16 to one hundred and seventy-five kilocycles and the secondary 20 is tuned by means of a condenser 21 to the same frequency. According to this invention windings 15 and 20 are relatively movable so as to vary the inductive coupling, that is to say, the degree of coupling therebetween. Although both the primary and secondary of transformer 19 are individually tuned to the intermediate frequency they will, if closely coupled, pass not only the beat frequency but also a considerable band of frequencies to either side thereof. In fact it is essential, as stated at the beginning of this specification, that a frequency band up to about sixteen kilocycles on each side of the carrier be passed in order to make possible reproduction of all the desirable tone frequencies. But, as already explained, a wide frequency band is incompatible with sharp selectivity—this being due to the fact that broadcast channel separation is only ten kilocycles. It would clearly not be possible at all to separate stations of comparable signal strength operating on adjacent frequency channels with a receiver adjusted to pass a band of frequencies even as high as ten kilocycles.

The width of the band of frequencies passed by the interstage coupling system comprising primary and secondary windings 15 and 20 depends upon the degree of coupling between them. With loose coupling the frequency band is greatly narrowed, whereas, with tight coupling it is broadened.

Figure 2:
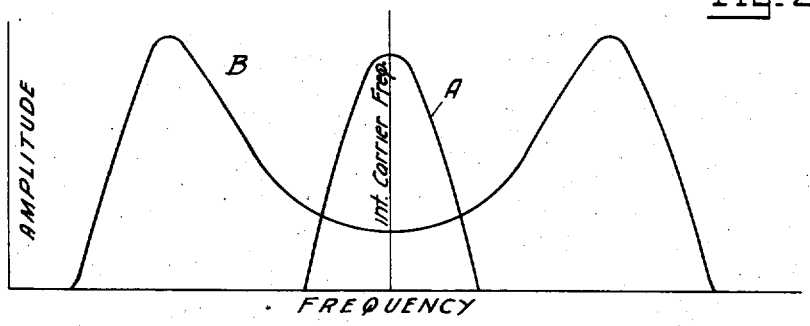

It is not practicable with a single coupling system such as that under discussion to secure both sufficiently sharp selectivity and a broad frequency band with anything like a close approximation to uniform attenuation of all frequencies within the desired band. This is graphically illustrated in Fig. 2 wherein A represents a resonance curve for loose coupling and B represents a resonance curve for close coupling—the abscissae representing frequency and the ordinates representing amplitude. It will be seen that according to curve B the carrier or intermediate frequency is greatly attenuated as compared with the side-band frequencies to either side thereof. This is an inherent condition as a result of which, it will be apparent, there could not be obtained with a single coupling system of the kind illustrated a satisfactory wide frequency band—except by introducing resistance into the circuit and thus impairing its selectivity. The present invention, however, cures this defect by compensating for it as will presently be explained.

Figure 3:
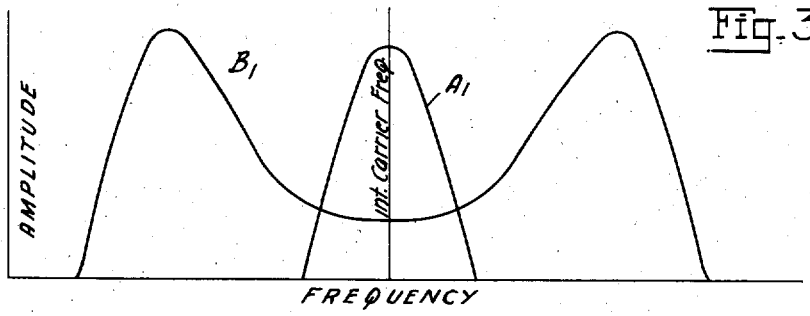

Between intermediate amplifier tubes 17 and 18 is a second coupling system identical with that just described comprising a coupling transformer 22 consisting of a primary winding 23 and a secondary winding 24 which are tuned each to one hundred and seventy-five kilocycles by condensers 25 and 26 respectively. The resonance characteristics of this coupling system are illustrated graphically by Fig. 3 which as will be seen is identical with Fig. 2.

Following the second intermediate frequency amplified tube 18 is a full wave diode rectifier tube 27 which functions as a detector to convert the amplified beat frequency wave into an audible frequency current corresponding to the signal-modulations of the incoming high frequency wave. The interstage coupling between the output side of the last intermediate frequency amplifier tube 18 and the detector 27 is of the same form as the coupling systems previously described, comprising as it does a coupling transformer 28 consisting of a primary 29 with tuning condenser 30 and secondary 31 with tuning condenser 32.

In each of the three successive interstage coupling systems to which reference has been made the primary and secondary windings are spacially adjustable with respect to one another for varying the degree of coupling therebetween and mechanical means to be described later are provided for effecting these adjustments simultaneously. The adjustments of the first two successive coupling systems, that is to say, the coupling system between tubes 11 and 17 and between tubes 17 and 18 may be assumed to be identical as illustrated graphically by Figs. 2 and 3 respectively; but the coupling adjustment mechanism to be hereinafter described is so designed as to bring about a different degree of relative movement of the primary and secondary windings of the interstage coupling comprising transformer 28. This is illustrated graphically by Fig. 4 wherein $A_2$ depicts the resonance curve for loose coupling and $B_2$ depicts the resonance curve for close coupling.

It will be observed that curve $B_2$ is considerably broader at the top than curve $A_2$ but is not as broad as curves B and $B_1$. However, curve $B_2$ dips but little at the midpoint corresponding to the intermediate frequency whereas curves B and $B_1$ indicate a very great attenuation of the intermediate frequency and the side band frequencies immediately to either side thereof.

Figure 4:
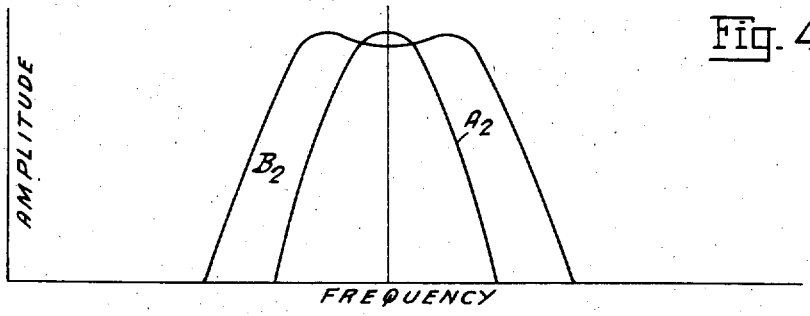
Figure 5:
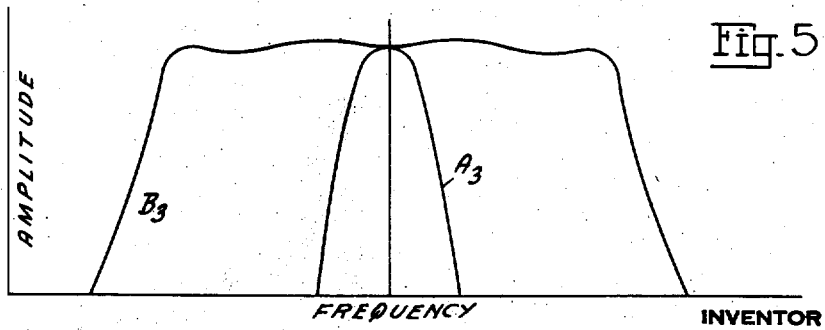

Fig. 5 illustrates graphically the effect of combining the three coupling systems in cascade. Here $A_3$ and $B_3$ are the resultant resonance curves for loose coupling and close coupling respectively. From an examination of these graphs it will be seen that by reason of the looser maximum coupling maintained in one of the coupling systems as illustrated by Fig. 4 there is achieved a resultant broad frequency band of approximately uniform amplitude for all frequencies included therein which is illustrated by the resonance curve $B_3$.

The graphs of Figs. 2, 3, 4, and 5 are illustrative of only two coupling adjustments, one of these being the adjustment for very sharp selectivity illustrated by curves A, $A_1$, $A_2$, and $A_3$ and the other being an adjustment for broad reception illustrated by curves B, $B_1$, $B_2$, and $B_3$.

The audio-frequency output of detector 27 is amplified by a three electrode audio-frequency amplifier tube 33, the output of which is coupled through an audio-frequency transformer 34 to the input end of an adjustable audio-frequency filter identified as a whole by reference numeral 35. This filter as shown comprises three inductance coils, 36, 37, 38, in series, and four sets of shunt capacities, 39, 40, 41, and 42. Each of these sets of shunt capacities may comprise, as illustrated, a group of condensers of respectively different capacities which are capable of being cut into circuit individually by the movable contactors, 43, 44, 45, 46.

The function of filter 35 is to effect a sharp cutoff of the higher audible frequencies whenever this is necessary in order to reduce or eliminate noise and/or the heterodyne whistle which sometimes occurs due to the presence of interfering carrier waves having an audible frequency difference.

When receiving from nearby stations or more distant powerful stations it is not usually necessary to suppress noise because the signal is generally so strong as to completely obscure it; and for that reason it is neither necessary nor desirable, under those circumstances, to suppress the higher frequencies, and the filter should accordingly be adjusted to be ineffective. As, however, the desired signals become increasingly weak, noise becomes increasingly objectionable on account of being more and more noticeable. The constituent noise frequencies within the same band as the reproduced signal frequencies cannot of course be eliminated by filtering because the filter will not distinguish between noise and signal of the same frequency. But, as stated at the outset, the signal is less impaired by elimination of the higher frequencies than is the noise and for that reason a very much better over-all result can be accomplished by impairing the signal through elimination of the higher frequencies and at the same time diminishing the noise by eliminating the same noise frequencies. In order to accomplish this and get the optimum balance between noise and signal for different degrees of signal strength it is desirable to have a filter which is adjustable to several cutoff points. In the arrangement illustrated in Fig. 1 the switches 39 to 41 inclusive have six points of adjustment. Whether or not it is necessary to provide as many filter adjustments as this is a matter of engineering judgment and a point which may be dismissed here as largely irrelevant.

In addition to the multi-contact switches which have already been referred to, there is still another designated by reference numeral 47. This switch is interposed in one of the filter input leads and its only purpose is to open the circuit concurrently with the opening of the other switches thereby preventing a clicking noise in the loudspeaker.

As previously stated, I have discovered that the optimum adjustment of the audio-filter bears in each instance a definite relation to the coupling adjustment of the intermediate frequency amplifier and I have found it to be practicable and desirable to mechanically tie together the several multi-contact switches of the filter and the means for adjusting the coupling of the intermediate frequency transformers. Also I have observed that the appropriate adjustment of the antenna switch 6 is definitely related to the intermediate frequency coupling adjustment and that of the filter, wherefore it is also practicable and desirable to arrange for operating the antenna switch simultaneously with the filter switches and the coupling adjusting means.

The output terminals of the audio-filter may be and are usually connected through a volume control to the input terminals of a power amplifier where the signals are amplified sufficiently to operate a suitable loudspeaker. The power amplifier and loudspeaker, however, have nothing to do with the present invention and for that reason have not been illustrated in the circuit diagram.

Included in the circuit diagram, Fig. 1, is an automatic volume control identified as a whole by reference numeral 72 and comprising an amplifier tube 73 and a diode rectifier 74. This feature is now too well known in the art to require a detailed description and it has no immediate and necessary bearing on the invention claimed. There is, however, a feature, believed to be novel, which is related to the invention claimed and which works in close conjunction with the automatic volume control and is thought worthy of special mention. What is referred to is the visual indicator or meter 75—which may be an ordinary D. C. milliammeter—the function of which will be explained. As depicted by curve $B_3$ of Fig. 5, when the intermediate frequency coupling systems are adjusted for close coupling, a frequency band of considerable width is passed with substantially uniform attenuation; and it follows that the signal can be tuned in with about the same degree of loudness at any point within this band. But while substantially uniform loudness obtains that is not true of the tone quality. Quality of tone is badly impaired if the receiver is off tune to any considerable extent—this being due to inequality of side bands.

The control grid of the automatic volume control amplifier tube 73 is connected through conductor 76 to one terminal of secondary 24 of the second adjustable coupling system, and since at close coupling there are two voltage peaks at either side of the beat frequency carrier, these are impressed upon the control grid of tube 73 giving rise to corresponding current peaks in the circuit of diode rectifier 74, in one branch of which is included, in series, the indicator or meter 75. The meter or other current responsive indicating device will, accordingly, give peak readings at each of two points equally distant from and at either side of the correct position of the tuning dial whenever a signal is picked up. This renders it easy for the operator to tune correctly in each instance and thereby obtain maximum tone quality when receiving sufficiently strong signals to enable the use of close coupling.

There are numerous elements included in the circuit diagram, Fig. 1, of which no specific mention has been made. These are all conventional and familiar elements of a modern superheterodyne broadcast receiver as will be readily observed by those skilled in the art and it is thought that nothing would be gained by burdening this specification with a detailed description thereof.

Figs. 6, 7, 8, and 9 illustrate a complete superheterodyne broadcast receiver chassis. Many of the elements shown have no immediate bearing on the present invention and the only reason for showing them is to illustrate their physical relation to those parts which are relevant to the invention. Those parts, therefore, which are not strictly essential to the disclosure have been shown in comparatively light lines thereby emphasizing the essential components.

The parts shown in Figs. 6 to 9 inclusive to which particular attention is to be directed are three transformer units, 48, 49, and 50 respectively, a rotary gang switch 51, a crank shaft 52, a connecting link 53, a switch shaft 54, and a cam 55. Each of the transformer units 48, 49, and 50 comprises, as its major constituents, a primary transformer winding 56 and a secondary transformer winding 57 together with a pair of small adjustable condensers 58 corresponding to the condensers 16, 21, 25, 26, 30 and 32 on the circuit diagram, Fig. 1. The primary windings are stationarily mounted on a cross-head of insulating material 59 which in turn is adjustably mounted on a pair of threaded rods 60 and 61. The secondary windings 57 are mounted on cross-heads of insulating material 62 which are slotted so as to slidably engage the rods 60 and 61 whereby to permit vertical movement of the secondary windings relatively to the primary windings, thus effecting variations in the degree of coupling between primaries and secondaries. The three cross-heads 62 are connected by means of connecting rods 63 to crank arms 64, 65, and 66, respectively, which, in turn, are mounted upon and rotatable with shaft 52, these cranks serve to move the secondary windings toward and away from the primary windings in response to arcuate rotation of shaft 52 as will be evident from an examination of Fig. 7. Shaft 52 is rotated arcuately by link 53 which is connected at one end to crank 67 and at the other end to a cam groove 55a in the cam member 55. A link 68 fulcrumed at 69 is pivotally connected to one end of link 53. Link 68 serves to support one end of link 53 while at the same time permitting that end to move horizontally in response to rotation of cam 55. The retractile spring 70 serves to hold the cam follower on link 53 tightly in contact with one face of the cam groove thereby avoiding backlash in the mechanism.

Cam plate 55 is mounted on shaft 54 and rotatable therewith as is likewise the movable contact members of the rotary gang switch 51. This gang switch is made up of the six multi-contact switches indicated in Fig. 1.

A control knob 71 designed for manual operation is connected to shaft 54, manipulation of which, as will be apparent, effects simultaneous adjustment of the six multi-contact switches and the three intermediate frequency transformers.

As explained with reference to the circuit diagram, Fig. 1, and the resonance curves Figs. 2 to 5 inclusive, the coupling variation in one of the three intermediate frequency coupling systems is less than that of the other two—the reason as explained being to bring about the desired compensatory effect thereby accomplishing an approximately uniform attenuation of all frequencies within a wide band as illustrated by resonance curve $B_3$ of Fig. 5. This is accomplished in the mechanism shown by making the crank 66 of shorter radius than cranks 64 and 65. The vertical movement of the secondary winding of transformer unit 50 is, therefore, less than that of units 48 and 49—the result being that the maximum coupling attainable in transformer unit 50 is less than the maximum coupling attainable in either of the other two transformer units.

As may be observed from an inspection of Fig. 9 for example, the transformer windings of units 48, 49, and 50 are capable of being quite widely separated and therefore very loosely coupled. This provision facilitates the novel method of individually tuning the component tuned circuits which was mentioned at the beginning of this specification. The method of procedure in tuning the coupling systems is to loosen the coupling between the primaries and secondaries in all three coupling systems, to a point below critical coupling, insert a micro-ammeter in the common leg of the rectifier circuit of diode 27 and then with the intermediate amplifier in operation receiving a signal wave of one hundred and seventy-five kilocycles from a signal generator, adjusting each tuned circuit of the coupling systems, one by one, to that frequency until a maximum reading is obtained on the aforementioned micro-ammeter. When all have been thus tuned the couplings can be readjusted, as required, to secure the broader resonance band, without disturbing the tuning.

It is, of course, necessary to exercise good engineering judgment and skill in order to carry out this invention and realize the best possible results, but the information herein set forth is believed to be entirely sufficient to enable those skilled in the art to do so.

It will be evident that there are numerous possible alternative mechanical arrangements for effecting the simultaneous adjustments as herein described but the specific arrangement illustrated is found to be a very convenient and economical one.

I have illustrated and described what I believe to be the best electrical and mechanical arrangements for carrying out this invention but I realize that there are many possible variations and modifications within the scope and purview of the inventive concept and I accordingly do not wish the invention to be regarded as limited except as indicated by the appended claims.

What is claimed is:

1. A radio receiving system comprising, in combination, a source of signal-modulated high frequency incoming waves, a local source of high frequency waves for beating with the incoming signal waves, means for combining said waves to produce a signal-modulated beat frequency wave, means for converting said beat frequency wave into a signal wave of audio-frequency, an adjustable coupling system interposed between said first mentioned means and said second mentioned means, said coupling system being designed to pass only a relatively narrow band of frequencies including the beat frequency but having means for rendering adjustable the width of the band passed, an audio-frequency low-pass filter having its input connected to said second mentioned means, said filter being provided with means for adjustably varying the point of cut-off thereof, and means common to said coupling system and said filter for effecting the aforementioned adjustments in unison.

2. A superheterodyne receiver including a frequency converter, an intermediate frequency amplifier, an intermediate frequency detector, and a low-pass filter connected to said detector, a plurality of coupling systems in cascade interposed between said frequency converter and said detector, each of said coupling systems being designed to pass a relatively narrow band of frequencies including the intermediate frequency and having means rendering adjustable the width of the effective frequency band passed thereby, said filter including means for adjusting its point of cut-off, and means common to said coupling systems and said filter for effecting the aforementioned adjustments in unison.

3. In a superheterodyne receiver, a source of signal-modulated high frequency incoming waves, a local source of high frequency waves for beating with the incoming signal waves, a translator for combining said waves to produce a signal-modulated intermediate frequency wave, an intermediate frequency amplifier including, in combination, a plurality of transformer units, each having a stationary winding and a movable winding inductively coupled thereto, and a coupling adjusting mechanism common to said units and operable to effect movement of said movable windings in unison, said mechanism comprising a crankshaft having a plurality of crank arms, links connecting said movable windings with said crank arms individually, a rotatable cam for driving said crankshaft and driving means connecting said cam and crankshaft, and a detector operable to convert the intermediate frequency wave into a signal wave of audible frequency.

4. In combination in a carrier wave system, means for selecting waves at at least one carrier frequency, means for varying the widths of the bands passed at said frequency, separate tone control means for varying the cut-off at audio frequency, and single control means for controlling and coordinating said varying means and said tone control means.

5. In a superheterodyne radio receiver having separate means for selection and amplification at radio frequency, intermediate frequency and audio frequency, means for varying the band widths passed at at least one carrier frequency, tone control means for varying the cut-off at audio frequency, and single control means for operating said varying means in coordination and in unison with said tone control means.

6. In a radio receiver having variable carrier frequency selecting means, demodulating means and separate variable audio frequency selecting means, single control means varying the width of the band passed by the carrier frequency selecting means in unison and in coordination with tone control means varying the audio frequency cut-off.

7. In combination in a radio receiver, variable cut-off audio frequency tone control means, variable band width carrier frequency selective means, and single control means for operating the tone control means and adjusting the width of the band passed by the carrier frequency selective means in proportion to the cut-off period of the tone control means.

8. A carrier frequency receiver having carrier frequency selectors whose passed band width is variable, audio frequency filters whose passed frequency characteristic is variable, and single control means for adjusting the passed band width and passed frequency characteristic simultaneously and in predetermined proportion to one another.

9. In a superheterodyne receiver having a radio frequency amplifier with tuned input and output circuits, an intermediate frequency amplifier with tuned coupling transformers and an audio frequency amplifier with filter circuits for varying the frequency response characteristic thereof, single control means for varying the selective characteristics of the intermediate frequency coupling transformers in unison and coordination with the audio frequency filter circuit variations.

LINCOLN WALSH.